(12) United States Patent
Jiang et al.

(10) Patent No.: US 11,311,905 B2
(45) Date of Patent: Apr. 26, 2022

(54) ULTRAVIOLET CURING DEVICE AND CONTROL METHOD THEREOF

(71) Applicant: Jiangsu Goodled Precision Optoelectronics Co., Ltd., Changzhou (CN)

(72) Inventors: Wenxian Jiang, Changzhou (CN); Jinhua Song, Changzhou (CN); Xiaoxiao Gong, Changzhou (CN); Jie Tu, Changzhou (CN); Dawei Xu, Changzhou (CN)

(73) Assignee: JIANGSU GOODLED PRECISION OPTOELECTRONICS CO., LTD, Jiangsu (CN)

( * ) Notice: Subject to any disclaimer, the term of this patent is extended or adjusted under 35 U.S.C. 154(b) by 325 days.

(21) Appl. No.: 16/497,526

(22) PCT Filed: Mar. 29, 2018

(86) PCT No.: PCT/CN2018/000117
§ 371 (c)(1),
(2) Date: Jan. 13, 2020

(87) PCT Pub. No.: WO2018/227945
PCT Pub. Date: Dec. 20, 2018

(65) Prior Publication Data
US 2022/0080455 A1    Mar. 17, 2022

(30) Foreign Application Priority Data

Jun. 13, 2017 (CN) .......................... 201710446553.3
Jun. 16, 2017 (CN) .......................... 201710462501.5
Jun. 16, 2017 (CN) .......................... 201720709648.5

(51) Int. Cl.
*B05D 3/06* (2006.01)
*B29C 35/08* (2006.01)
*H01L 33/64* (2010.01)

(52) U.S. Cl.
CPC .......... *B05D 3/067* (2013.01); *B29C 35/0805* (2013.01); *H01L 33/648* (2013.01); *B29C 2035/0827* (2013.01)

(58) Field of Classification Search
CPC ... B05D 3/067; B26C 35/0805; H01L 33/648; B29C 2035/0827
(Continued)

(56) References Cited

U.S. PATENT DOCUMENTS 6,798,214 B1\* 9/2004 Klevens ............... G01R 35/007
                                                         324/549
11,117,533 B1\* 9/2021 Wiers ....................... B60L 53/14
2015/0378415 A1\* 12/2015 George .................... G11C 5/04
                                                         307/64

FOREIGN PATENT DOCUMENTS

CN         101109073 A         1/2008
CN         107029964 A         8/2017
(Continued)

OTHER PUBLICATIONS

International Search Report dated Jun. 21, 2018, Application No. PCT/CN2018/000117.

*Primary Examiner* — Nicole M Ippolito
(74) *Attorney, Agent, or Firm* — The Dobrusin Law Firm, PC; Bryan S. Lemanski

(57) ABSTRACT

An ultraviolet curing device and a control method thereof. The device comprises an ultraviolet light source and a controller connected by means of a cable. The ultraviolet light source is a water-cooled ultraviolet light source or an air-cooled ultraviolet light source. The controller is provided inside or outside of the ultraviolet light source. The ultra- (Continued)

violet light source comprises a shell (101), a copper substrate (103), multiple paths of LED chips (104), and a cooling assembly. The controller comprises a constant-current circuit board (105). The constant-current circuit board (105) performs multi-path constant-current control on the multiple paths of LED chips (104) to monitor anomaly of the voltage drop of the multiple paths of LED chip (104)s, thereby achieving control of the multiple paths of LED chips (104).

25 Claims, 9 Drawing Sheets

(58) Field of Classification Search
USPC .............................. 250/492.1, 493.1, 504 R
See application file for complete search history.

(56) References Cited

FOREIGN PATENT DOCUMENTS

| | | |
|---|---|---|
| CN | 107300665 A | 10/2017 |
| CN | 206786374 U | 12/2017 |
| CN | 207132101 U | 3/2018 |
| KR | 20170036954 A | 4/2017 |

\* cited by examiner

ULTRAVIOLET CURING DEVICE AND
CONTROL METHOD THEREOF

BACKGROUND OF THE INVENTION

1. Field of the Invention

The invention relates to an ultraviolet curing device and a control method thereof.

2. Description of the Related Art

Emergency of the UV-LEDs has brought about revolutionary changes in the UV curing industries. The UV-LED has the advantages of constant light intensity, excellent temperature control, and it is easy to carry and is environmental friendly; in addition, its purchasing cost is relatively low and cost for maintenance is almost zero, all of which make contribution to the improvement of quality of the UV curing process and to energy conservation and consumption reduction. The large UV-LED curing machine has a plurality of LED light sources, and each of the LED light sources has a multi-path LED chip. The LED chips performs control in a multi-path constant current manner, so as to make the output current better match the device. Structure of the ultraviolet curing device and the control method thereof need to be designed further for better performances.

SUMMARY OF THE INVENTION

It is an object of the present invention to provide an ultraviolet curing device and a control method thereof.

In order to achieve the above-mentioned object, the present invention adopts the following technical solutions:

An ultraviolet curing device, comprising: an ultraviolet light source and a controller connected by means of a cable, wherein the ultraviolet light source is a water-cooled ultraviolet light source or an air-cooled ultraviolet light source; the controller is provided inside or outside of the ultraviolet light source; the ultraviolet light source comprises a shell, a copper substrate, a multiple paths of LED chips, and a cooling assembly; the controller comprises a constant-current circuit board, which performs multi-path constant-current control on the multiple paths of LED chips to monitor anomaly of the voltage drop of the multiple paths of LED chips.

In a first preferred embodiment, the ultraviolet light source is a water-cooled ultraviolet light source, and the water-cooled ultraviolet light source comprises: a shell, a light source water-cooled block, a copper substrate, a multiple paths of LED chips, a constant-current board water-cooled block and a flat glass or a secondary optical glass; the light source water-cooled block is disposed in an interior of the shell along a length direction of the shell, and a first water inlet, a first water outlet and a first water storage cavity that is arranged in a middle portion are disposed on the light source water-cooled block; the copper substrate is fixed to the water-cooled block in segments; the multiple paths of LED chips are disposed on the copper substrate in segments respectively; a plurality of the constant-current circuit boards are provided on both sides of the constant-current board water-cooled block in two rows along the length direction of the shell, and each of the plurality of constant-current circuit boards is electrically connected to each of the multiple paths of LED chips respectively; a second water inlet, a second water outlet and a second water storage cavity are disposed on the constant-current board water-cooled block; and the multiple paths of LED chips are covered with the flat glass or the second optical glass.

The constant-current board water-cooled block is fixed to a shell of the light source water-cooled block by means of water-cooled block supports.

There are two water-cooled block supports, and the constant-current board water-cooled block is supported by the two water-cooled block supports at two ends thereof; or there are a plurality of the water-cooled block supports, the constant-current board water-cooled block is supported by the plurality of the water-cooled block supports at the bottom thereof.

A water distribution bus is fixed within one end of the shell; a water inlet for allowing an entry of external cooled water, and a water distribution opening for distributing the cooled water to the light source water-cooled block and the constant-current board water-cooled block, are arranged on the water distribution bus.

Light shields are symmetrically disposed outside of the shell along the length direction of the shell; a length of the light shields is not less than a length of the multiple paths of LED chips.

The light shields are L-shaped or H-shaped, and are provided with a plurality of fixing holes on a vertical side.

Two ends of the copper substrate are fixed with the shell by means of a light source block; two side edges of the flat glass or the optical glass in a length direction thereof are fixed by means of a glass cardboard.

The glass cardboard is divided into two segments on left and right sides, or more than two segments.

Two first water storage cavities are disposed on the light source water-cooled block; each of the two water storage cavities is in communication with a first water inlet and a first water outlet; and the copper substrate is divided into two rows, each of the two water storage cavities corresponds to a row of the copper substrate.

Each row of the copper substrate is provided in segments, and the multiple paths of LED chips are provided on each segment of the copper substrate.

The ultraviolet light source further comprises a reflector and a reflector water-cooled block; the water distribution opening of the water distribution bus distributes the cooled water to the reflector water-cooled block.

Water pipes used in the ultraviolet light source are stainless steel pipes.

The controller of the ultraviolet curing device comprises a monitoring circuit for light source energy, a monitoring circuit for external environment temperature, a fault alarm circuit and a communication module; and the communication module is a wired communication module or a wireless communication module.

In a second preferred embodiment, the air-cooled ultraviolet light source comprises a shell, a heat dissipation module, LED chips and a fan fixing plate; the shell comprises an upper shell and a lower shell; the heat dissipation module is fixed within an interior of the upper shell and comprises a heat conduction cooper pipe and a heat dissipation fin; the fan fixing plate is disposed at a side wall of the upper shell, and has at least a fan thereon; the LED chips are disposed at a bottom of the heat dissipation module, and the flat glass or the optical glass covers outside of the LED chips. The controller of the ultraviolet curing device comprises a monitoring circuit for light source energy, a monitoring circuit for external environment temperature, a fault alarm circuit and a communication module; and the communication module is a wired communication module or a wireless communication module.

In a third preferred embodiment, the ultraviolet light source is the water-cooled ultraviolet light source, and the water-cooled ultraviolet light source comprises an electrical box, two end plates, a water-cooled base, a copper substrate and LED chips; each of end plates is fixed to each of the left and right ends of the electrical box, and an upper portion of the two end plates is symmetrically provided with through-holes; an upper end surface of the electrical box is provided with two water-cooled bases which can open/close in forward and backward directions, respectively; opposite sides of the two water-cooled bases are provided with grooves extending in a left-right direction and penetrating through left and right end faces of the two water-cooled bases, a plurality of copper substrates are fixed in the grooves, and LED chips are disposed on each of plurality of copper substrates; after the two water-cooled bases close, the LED chips on the two water-cooled bases are at the same height of the through-holes on the end plates.

A constant-current distribution plate and a multi-path constant-current board are provided in an interior of the electrical box; the constant-current distribution plate and the multi-path constant-current board are electrically connected; and the multi-path constant-current board is electrically connected to the LED chips in the grooves of the two water-cooled bases, respectively.

A plurality of mounting seats are fixed and arranged on the upper end face of the electrical box; two rocker arms are pivotably connected to front and rear ends of each of the plurality of mounting seats; and the two water-cooled bases are fixed on the rocker arms located at the front and rear ends of the mounting seat respectively.

The through-holes in the two end plates are provided with a quartz glass tube of high transmittance.

The water-cooled base is provided with a heat dissipation hole in a middle portion of a side surface of the groove, a heat dissipation fan is mounted on the heat dissipation hole, and left and right sides of the heat dissipation hole are provided with a groove respectively, a copper substrate is fixed in each of the grooves, and LED chips are fixed on the copper substrate; a water inlet and a water outlet are arranged on a back surface of each of the grooves, and a cooling water channel, in connection with the water inlet and the water outlet, is provided in the water-cooled base.

A reflector is mounted on groove walls on both sides of the groove of the water-cooled base.

The LED chips are covered with the flat glass or the optical glass.

Both sides of the flat glass or the optical glass are inserted into mounting slots at a lower portion of the reflector.

A handle is provided in the middle portion of the upper end face of the water-cooled base.

The controller of the ultraviolet curing device comprises a monitoring circuit for light source energy, a monitoring circuit for external environment temperature, a fault alarm circuit and a communication module; and the communication module is a wired communication module or a wireless communication module.

A method for controlling the ultraviolet curing device, using the ultraviolet curing device, comprising the following steps:
  (1) numbering each of the multiple paths of LED chips;
  (2) automatically calibrating an energy voltage reference value of each of the light sources;
  (3) reading the energy voltage reference value corresponding to each of the light sources;
  (4) collecting a voltage value of each of the multiple paths of LED chips of each of the light sources by a AD circuit during the operation of each of the light sources; and
  (5) determining whether each of the multiple paths of LED chips in each of the light sources is open-circuited and short-circuited in a sequenced number, when it shows that one of multiple paths of LED chips is open-circuited or short-circuited, a corresponding alarm information will be displayed and output.

A numbering rule of step (1) is as follows: each of the light sources is numbered from 0, and each of multiple paths of LED chips of the light sources is numbered from 0.

The automatic calibrating method of step (2) comprises the following steps:
  I. automatically setting an output energy of the Nth-path light source to be 30%, illuminating the light source, then collecting a current voltage value, and saving the current voltage value as a reference value;
  II. automatically setting an output energy of the Nth-path light source to be 40%, illuminating the light source, then collecting a current voltage value, and saving the current voltage value as a reference value;
  III. automatically setting an output energy of the Nth-path light source to be 50%, illuminating the light source, then collecting a current voltage value, and saving the current voltage value as a reference value;
  IV. automatically setting an output energy of the Nth-path light source to be 60%, illuminating the light source, then collecting a current voltage value, and saving the current voltage value as a reference value;
  V. automatically setting an output energy of the Nth-path light source to be 70%, illuminating the light source, then collecting a current voltage value, and saving the current voltage value as a reference value;
  VI. automatically setting an output energy of the Nth-path light source to be 80%, illuminating the light source, then collecting a current voltage value, and saving the current voltage value as a reference value;
  VII. automatically setting an output energy of the Nth-path light source to be 90%, illuminating the light source, then collecting a current voltage value, and saving the current voltage value as a reference value; and
  VIII. automatically setting an output energy of the Nth-path light source to be 100%, illuminating the light source, then collecting a current voltage value, and saving the current voltage value as a reference value.

The method for the determination of the open circuit in step (5) comprises: the AD circuit collects the voltage value of one of the multiple paths of LED chips of one of light sources and counts the voltage value; if the voltage value is <2.5V for a consecutive times, it is determined that the one of multiple paths of LED chips is open-circuited, and the alarm is displayed and output; if the voltage value is not <2.5V for a consecutive times, it is determined that the one of multiple paths of LED chips is short-circuited.

If the voltage value of one of the multiple paths of LED chips is <2.5V for a consecutive 11 times, it is determined that the one of multiple paths of LED chips is open-circuited, and the alarm is displayed and output; if the voltage value is not <2.5V for a consecutive 11 times, it is determined that the one of multiple paths of LED chip is short-circuited.

The method for the determination of the short circuit in step (5) comprises: comparing the current voltage value of the one of multiple paths of LED chips with the corresponding reference value to obtain a difference value, if the difference value is ≥1.5 V appears for a consecutive several times, it is determined that the one of multiple paths of LED chips is short-circuited, and the alarm is displayed and output; if the difference value is not ≥1.5 V for a consecutive several times, determination of the open circuit and short circuit for the next one of multiple path of LED chips is performed.

If the difference value between the current voltage value of the one of multiple paths of LED chips and the corresponding reference value is ≥1.5 V for a consecutive 11 times, it is determined that the one of multiple paths of LED chips is short-circuited, and the alarm is displayed and output; if the difference value is not ≥1.5 V for a consecutive 11 times, determination of the open circuit and short circuit for the next one of the multiple paths of LED chips is performed.

The multiple paths of LED chips are welded to the copper substrate, connecting wires for the multiple paths of LED chips are embedded in the copper substrate; optical effects is simulated via the copper substrate by using a software in the design process thereof, and suitable types of chips and suitable arrangement for LED lamp beads are selected according to the desired energy, so as to bring out the optimum illumination effect; the lamp beads are arranged in the following way: 1-N lamp beads are connected in parallel with each other, then they are connected in series, wherein N is a natural number; or 1-N lamp beads are connected in series with each other, then they are connected in parallel, wherein N is a natural number; or all of the lamp beads are connected in series.

By adopting the above-mentioned technical solutions, the present invention has the following advantageous effects.

(1) The constant-current circuit board in the ultraviolet curing device performs multi-path constant-current control on the multiple paths of LED chips to monitor anomaly of the voltage drop of the multiple paths of LED chips, thereby achieving control of the multiple paths of LED chips.

(2) The present invention is provided with a plurality of constant-current circuit boards. All of the circuit boards may be various small constant-current modules, and the multiple paths of LED chips may be of various types. In this case, power supply and control of the multiple paths of UV-LED chips is done within a limited volume of the light source.

(3) The present invention uses a water-cooled block to dissipate heat from the LED chips, thereby improving heat dissipation capability and prolonging the service life of the LED chips.

(4) The copper substrate of the ultraviolet curing device according to the present invention is provided in segments, and multiple paths of LED chips, preferably the same number of LED chips, are provided on each segment of the copper substrate, so as to avoid damaging a single chip and thus to avoid making the entire light source unusable, and the stability of chips in the large-scale UV-LED light source is greatly improved, and the advantage of a long service life is highlighted.

(5) This invention uses a mixed rows of chips of different types, and reduces the screening accuracy for the voltage of the chip, thereby significantly reducing the costs of the light source.

(6) The presence of the light shied of the ultraviolet curing device according to the present invention may avoid the leakage of the ultraviolet and the pollution of the environment.

(7) Typically, water pipes used inside of the water-cooled ultraviolet light source are stainless steel pipes, which are safer, more reliable, high temperature resistant and are less affected by the external temperature when compared with the conventional PU hoses.

(8) The two water-cooled bases of the ultraviolet curing device according to the present invention can open/close in forward and backward directions, respectively, which may facilitate its assembly and disassembly and chip inspection; an inner hole illumination structure may allow the curing of the cables in an efficient and continuous manner, and the UV-LED curing machine may be widely used.

(9) The ultraviolet curing device according to the present invention is provided with a current-constant distribution plate and a multi-path constant-current board for processing temperatures and driving the chips, so as to make the operation of the chips stable.

(10) The two water-cooled bases of the ultraviolet curing device according to the present invention are each fixed on the rocker arms located at the front and rear ends of the respective mounting seat, therefore, the structure is very compact.

(11) The through-holes in the two end plates are provided with a quartz glass tube of high transmittance, which may protect the LED chips.

(12) The water-cooled bases of the ultraviolet curing device according to the present invention uses two independent cooling water channels for cooling by circulation, which ensures a better cooling effect.

(13) A reflector is mounted on groove walls on both sides of the groove of the water-cooled base, such that intensive illumination can be achieved, and curing efficiency can be improved.

(14) A transparent glass is covered on the LED chips, which can further protect the LED chips and increase the irradiation energy.

(15) Both sides of the transparent glass are inserted into mounting slots at a lower portion of the reflector, through which easy installation, replacement or maintenance can be achieved.

(16) A handle is provided in the middle portion of the upper end face of the water-cooled base for opening/closing of the water-cooled base.

(17) Determining whether each of multiple paths of LED chips in each light source is open-circuited and short-circuited in a sequenced number, then it may be accurately determined that the anomaly of the voltage drop is caused by which path of LED chips being open-circuited and short-circuited; as a result, prompt maintenance can be done, so as to resolve the anomaly of the chips during the operation of the light source in time.

BRIEF DESCRIPTION OF THE DRAWINGS

The accompanying drawings, together with the specification, illustrate exemplary embodiments of the present disclosure, and, together with the description, serve to explain the principles of the present invention.

REFERENCE NUMERALS IN THE DRAWINGS

Figure 1:
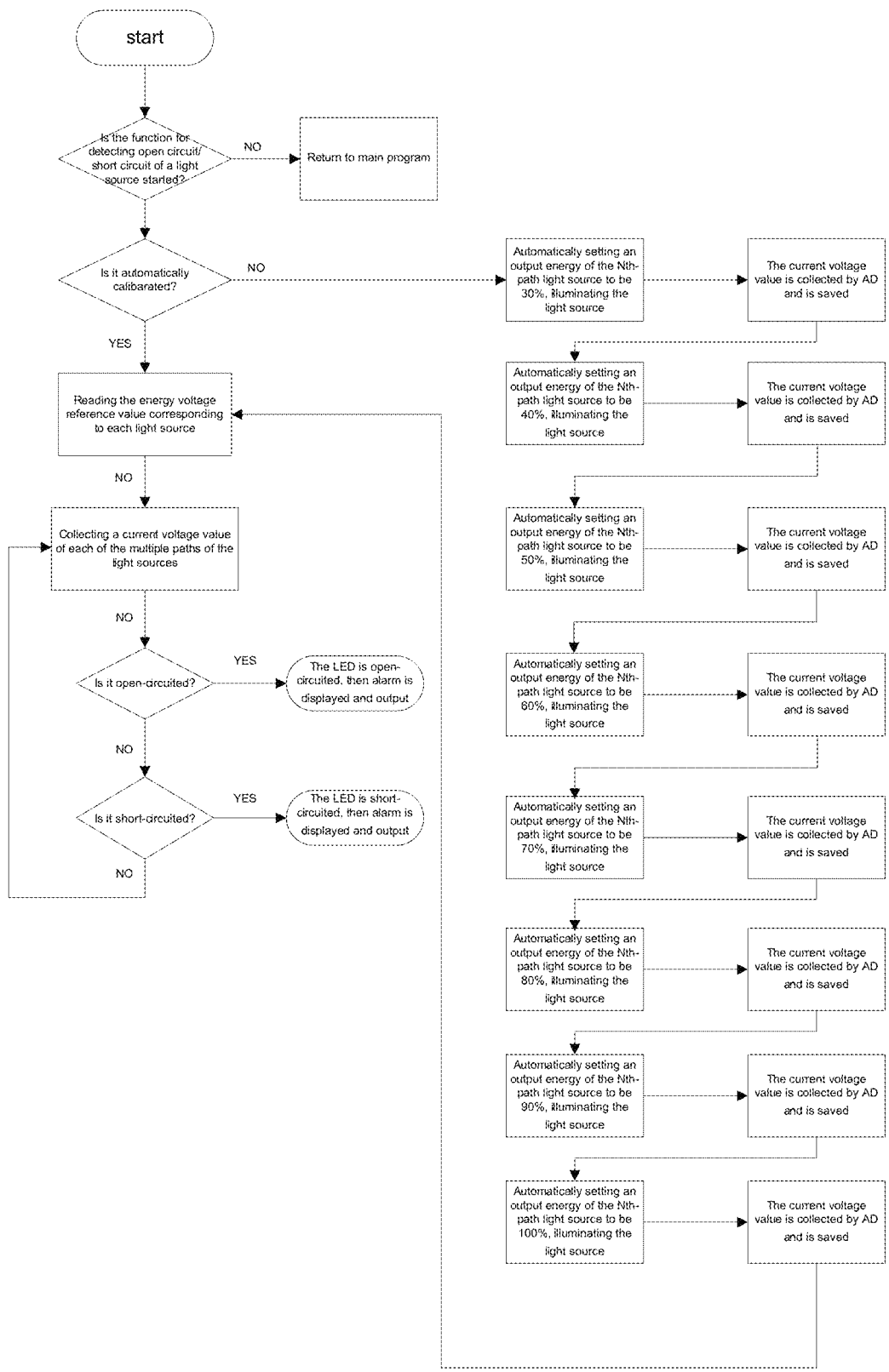
FIG. 1 is a flow chart of the present invention.

Embodiment I 100, shell 101, light source water-cooled block 102, first water inlet 102-1, first water outlet 102-2, first water storage cavity 102-3, copper substrate 103, LED chip 104, constant-current circuit board 105, constant-current board water-cooled block 106, second water inlet 106-1, second water outlet 106-2, second water storage cavity 106-3, flat glass 107, water-cooled block support 108, water distribution bus 109, light shield 1010, vertical side 1010-1, fixing hole 1010-2, light source block 1011, glass cardboard 1012, reflector and reflector water-cooled block 1013;

Embodiment II 200, electrical box 201, end plate 202, water-cooled base 203, heat dissipation hole 203-1, water inlet 203-2, water outlet 203-3, cooling water channel 203-4, handle 203-5, copper substrate 204, LED chip 205, mounting base 206, rocker arm 206-1, quartz glass tube of high transmittance 207, reflector 208, optical glass 209;

Embodiment III 300, upper shell 301, air vent 301-1, air deflector 301-2, lower shell 302, heat dissipation module 303, heat conduction copper pipe 304, heat dissipation fin 305, LED chip 306, fan fixing plate 307, fan 308, glass 309, copper substrate 3010.

DETAILED DESCRIPTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

FIG. 1 is a flow chart of a control method. An ultraviolet curing device comprises an ultraviolet light source and a controller connected by means of a cable, wherein the ultraviolet light source is a water-cooled ultraviolet light source or an air-cooled ultraviolet light source; the controller is provided inside or outside of the ultraviolet light source; the controller comprises a constant-current circuit board, which performs multi-path constant-current control on the multiple paths of LED chips to monitor anomaly of the voltage drop of the LED chips. The LED chips are welded to the copper substrate, connecting wires are embedded in the copper substrate; optical effects is simulated via the copper substrate by using a software in the design process thereof, and suitable types of chips and suitable arrangement for LED lamp beads are selected according to the desired energy, so as to bring out the optimum illumination effect; the lamp beads are arranged in the following way: 1-N lamp beads are connected in parallel with each other, then they are connected in series, wherein N is a natural number; or 1-N lamp beads are connected in series with each other, then they are connected in parallel, wherein N is a natural number; or all of the lamp beads are connected in series.

The constant-current circuit board may be a large current constant-current circuit or a constant-current circuit of 8 A; the large current constant-current circuit adopts BUCK topology and PI regulating circuit, which can stably output a large current up to 25 A; the constant-current circuit of 8 A can stably output a current up to 8 A, and the current can be adjusted between 0 A and 8 A, and its accuracy reaches 2%.

A method for the constant-current circuit board to perform multi-path constant-current control on the multiple paths of LED chips to monitor anomaly of the voltage drop of the LED chip comprises the following steps:

(1) numbering each of the multiple paths of LED chips, and the numbering rule is as follows: each of the light sources is numbered from 0, and each of multiple paths of LED chips of the light sources is numbered from 0.

(2) automatically calibrating an energy voltage reference value of each of the light sources, and the automatic calibrating method comprises the following steps:

I. automatically setting an output energy of the Nth-path light source to be 30%, illuminating the light source, then collecting a current voltage value, and saving the current voltage value as a reference value;

II. automatically setting an output energy of the Nth-path light source to be 40%, illuminating the light source, then collecting a current voltage value, and saving the current voltage value as a reference value;

III. automatically setting an output energy of the Nth-path light source to be 50%, illuminating the light source, then collecting a current voltage value, and saving the current voltage value as a reference value;

IV. automatically setting an output energy of the Nth-path light source to be 60%, illuminating the light source, then collecting a current voltage value, and saving the current voltage value as a reference value;

V. automatically setting an output energy of the Nth-path light source to be 70%, illuminating the light source, then collecting a current voltage value, and saving the current voltage value as a reference value;

VI. automatically setting an output energy of the Nth-path light source to be 80%, illuminating the light source, then collecting a current voltage value, and saving the current voltage value as a reference value;

VII. automatically setting an output energy of the Nth-path light source to be 90%, illuminating the light source, then collecting a current voltage value, and saving the current voltage value as a reference value; and VIII. automatically setting an output energy of the Nth-path light source to be 100%, illuminating the light source, then collecting a current voltage value, and saving the current voltage value as a reference value.

(3) reading the energy voltage reference value corresponding to each of the light sources;

(4) collecting a voltage value of each of the multiple paths of LED chips of each of the light sources by a AD circuit during the operation of each of the light sources; and determining whether each of the multiple paths of LED chips in each of the light sources is open-circuited and short-circuited in a sequenced number, when it shows that one of multiple paths of LED chips is open-circuited or short-circuited, a corresponding alarm information will be displayed and output; wherein, the method for the determination of the open circuit comprises: the AD circuit collects the voltage value of one of the multiple paths of LED chips of one of the light sources and counts the voltage value; if the voltage value is <2.5V for a consecutive times, it is determined that one of multiple paths of the LED chips is open-circuited, and the alarm is displayed and output; if the voltage value is not <2.5V for a consecutive times, it is determined that the one of multiple paths of LED chips is short-circuited. If the voltage value of one of the multiple paths of LED chip is <2.5V for a consecutive 11 times, it is determined that the one of multiple paths of LED chips is open-circuited, and the alarm is displayed and output; if the voltage value is not <2.5V for a consecutive 11 times, it is determined that the one of multiple paths of LED chip is short-circuited. The method for the determination of the short circuit comprises: comparing the current voltage value of the one of multiple paths of LED chips with the corresponding reference value to obtain a difference value, if the difference value is ≥1.5 V for a consecutive several times, it is determined that the one of multiple paths of LED chips is short-circuited, and the alarm is displayed and output; if the difference value is not ≥1.5 V for a consecutive several times, determination of the open circuit and short circuit for the next one of multiple paths of LED chips is performed. If the difference value between the current voltage value of the one of multiple paths of LED chips and the corresponding reference value is ≥1.5 V for a consecutive 11 times, it is determined that the one of multiple paths of LED chips is short-circuited, and the alarm is displayed and output; if the difference value is not ≥1.5 V for a consecutive 11 times, determination of the open circuit and short circuit for the next one of the multiple paths of LED chip is performed.

Embodiment I

Figure 2:
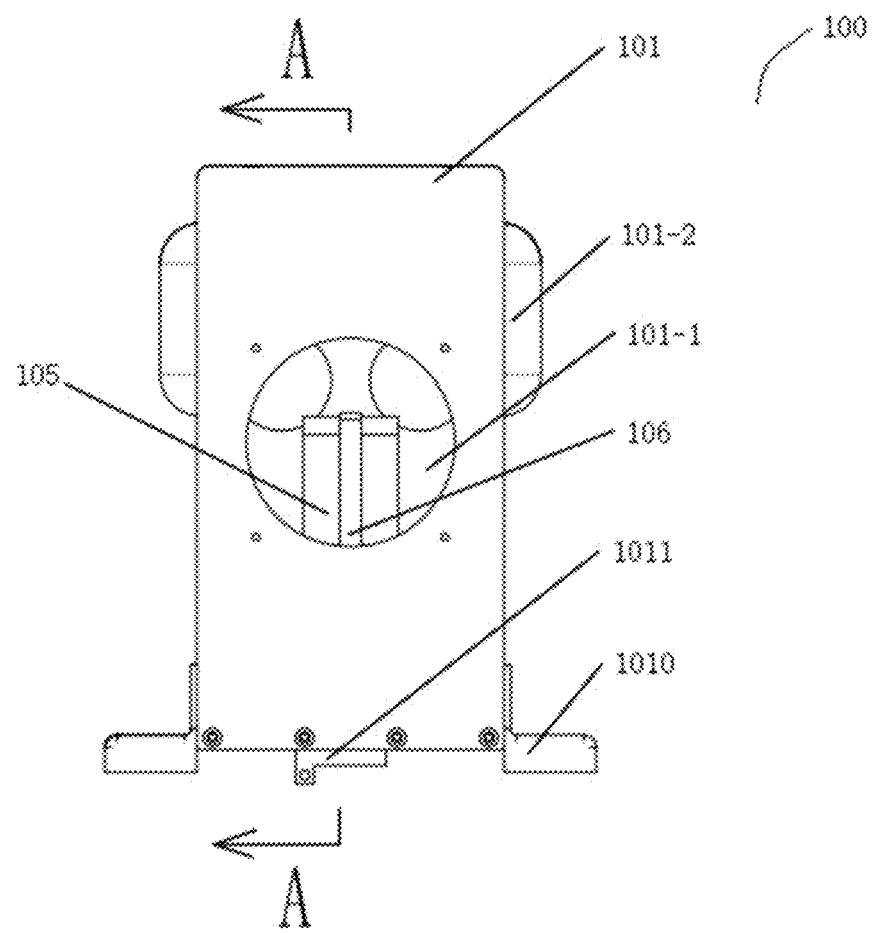
FIG. 2 is a front view of an embodiment 1.
Figure 3:
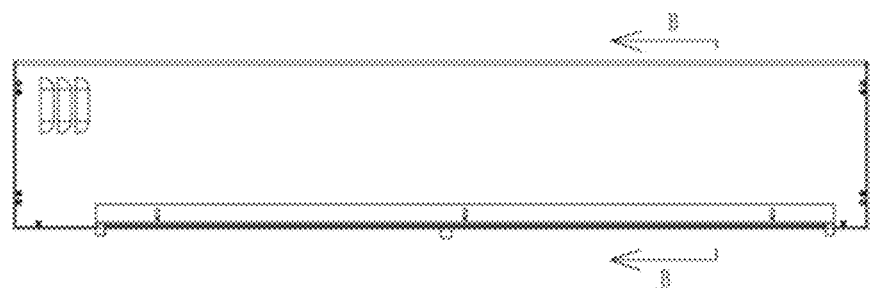
FIG. 3 is a right side view of FIG. 2.
Figure 4:
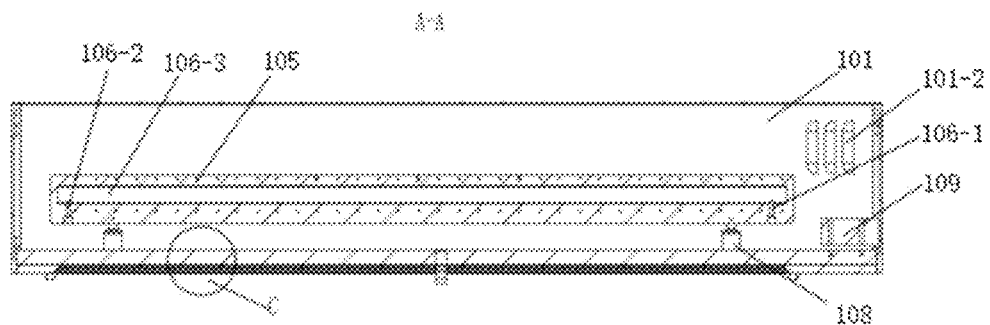
FIG. 4 is a sectional view taken along line A-A of FIG. 2.
Figure 5:
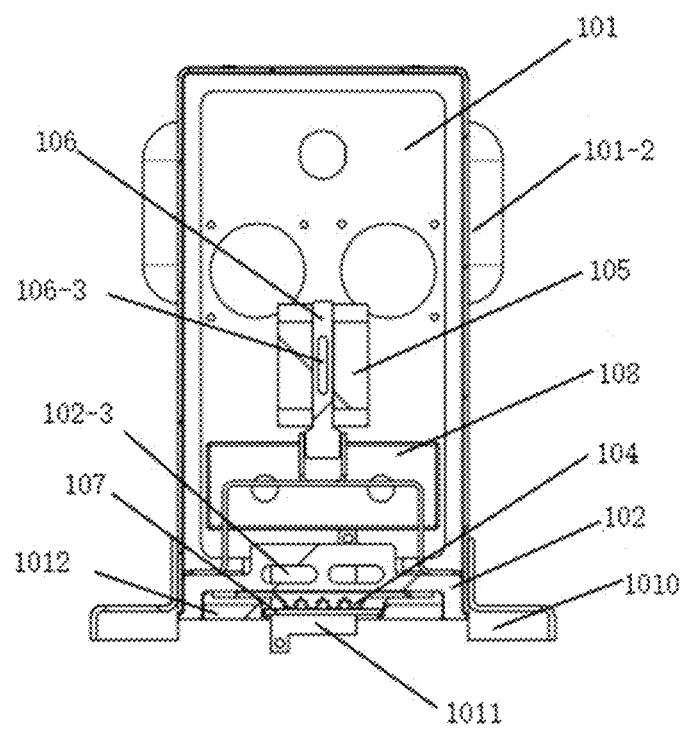
FIG. 5 is a sectional view taken along line B-B of FIG. 3.
Figure 6:
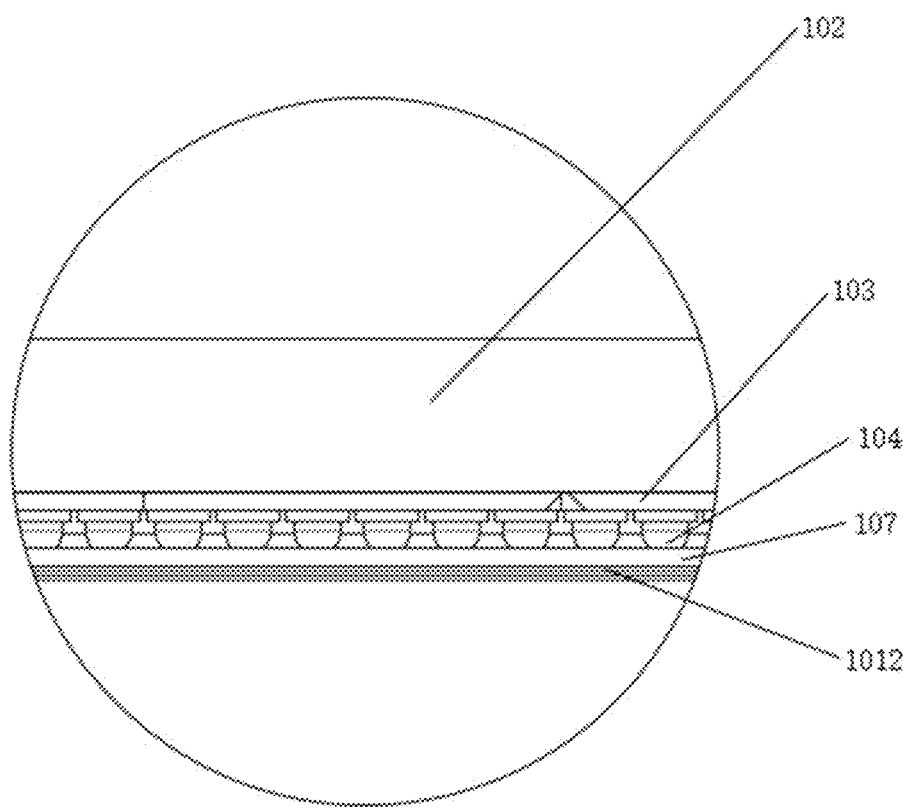
FIG. 6 is an enlarged detail view of a portion C of FIG. 3.
Figure 7:
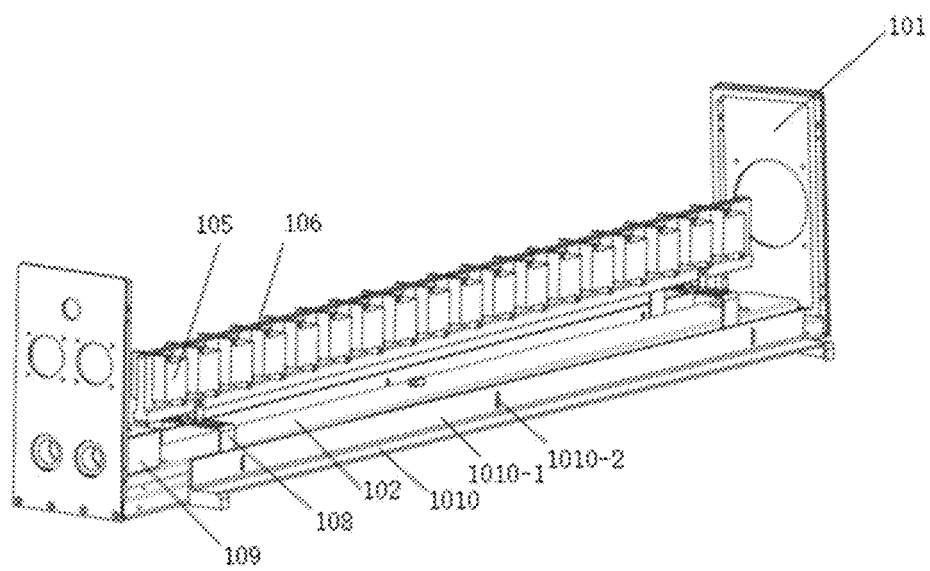
FIG. 7 is a perspective view of an embodiment 1 from which a part of a shell is removed.

Referring to FIGS. 2 and 7, an ultraviolet curing device in this embodiment comprises an ultraviolet light source and a controller. The controller comprises a monitoring circuit for light source energy, a monitoring circuit for external environment temperature, a fault alarm circuit and a communication module; and the communication module is a wired communication module or a wireless communication module, including Ethernet communication, RS232 communication, RS485 communication, CAN communication, GPRS/GPS communication, WIFI communication, and Bluetooth communication, etc. The structure of the ultraviolet light source (the controller is provided inside of the ultraviolet light source) is shown, comprising a shell 101, a light source water-cooled block 102, a copper substrate 103, LED chips 104, a constant-current circuit board 105, a constant-current board water-cooled block 106 and a flat glass 107; the light source water-cooled block 102 is disposed in an interior of the shell 101 along a length direction of the shell 101, and a first water inlet 102-1, a first water outlet 102-2 and a first water storage cavity 102-3 that is arranged in a middle portion are disposed on the light source water-cooled block 102; the copper substrate 103 is fixed to the water-cooled block 102; the LED chips 104 are disposed on the copper substrate 103; a plurality of the constant-current circuit boards 105 are provided on both sides of the constant-current board water-cooled block 106 in two rows along the length direction of the shell 101, and each of the plurality of constant-current circuit boards 106 is electrically connected to the respective LED chip; a second water inlet 106-1, a second water outlet 106-2 and a second water storage cavity 106-3 are disposed on the constant-current board water-cooled block 106; and the LED chips 104 are covered with the flat glass 107. The constant-current board water-cooled block 106 is fixed to a shell of the light source water-cooled block 102 by means of water-cooled block supports 108. There are two water-cooled block supports 108, and the constant-current board water-cooled block 106 is supported by the two water-cooled block supports 108 at two ends thereof. A water distribution bus 109 is fixed within one end of the shell 101; a water inlet for allowing an entry of external cooled water, and a water distribution opening for distributing the cooled water to the light source water-cooled block 102 and the constant-current board water-cooled block 106, are arranged on the water distribution bus 109. Light shields 1010 are symmetrically disposed outside of the shell 101 along the length direction of the shell 101; a length of the light shields 1010 is not less than a length of the LED chip 104. The light shields are L-shaped, and are provided with a plurality of fixing holes 1010-2 on a vertical side 1010-1. Two ends of the copper substrate 103 are fixed with the shell 101 by means of a light source block 1011; two side edges of the flat glass 107 in a length direction thereof are fixed by means of a glass cardboard 1012. The glass cardboard 1012 is divided into a plurality of segments. Two first water storage cavities 102-3 are disposed on the light source water-cooled block 102; each of the two water storage cavities 102-3 is in communication with a first water inlet 102-1 and a first water outlet 102-2; and the copper substrate 103 is divided into two rows, each of the two water storage cavities 102-3 corresponds to a row of the copper substrate 103. Each row of the copper substrate 103 is provided in segments, and an equal number of LED chips 104 are provided on each segment of the copper substrate 103, and individual LED chip 104 may be of different types of chips for coordinating with different constant-current circuit boards 105, such that the multiple paths of UV-LED chips may be powered and under control.

Figure 8:
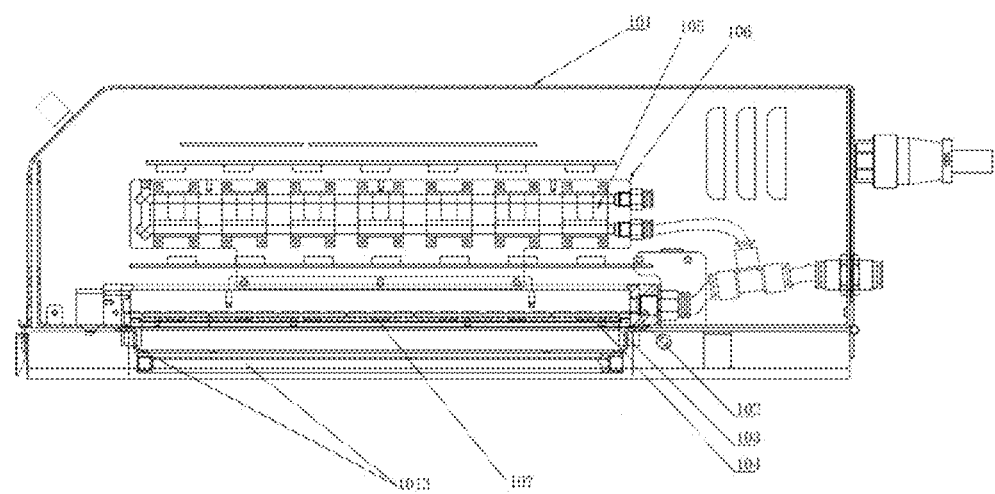
FIG. 8 is another structure diagram of this embodiment, in which a reflector and a reflector water-cooled block are provided.

Referring to FIG. 8, a reflector and a reflector water-cooled block may be provided upon this embodiment, wherein the reflector is used to absorb the excess ultraviolet light heat and ensure the light source may work stably for a long period of time.

Embodiment 2

Figure 9:
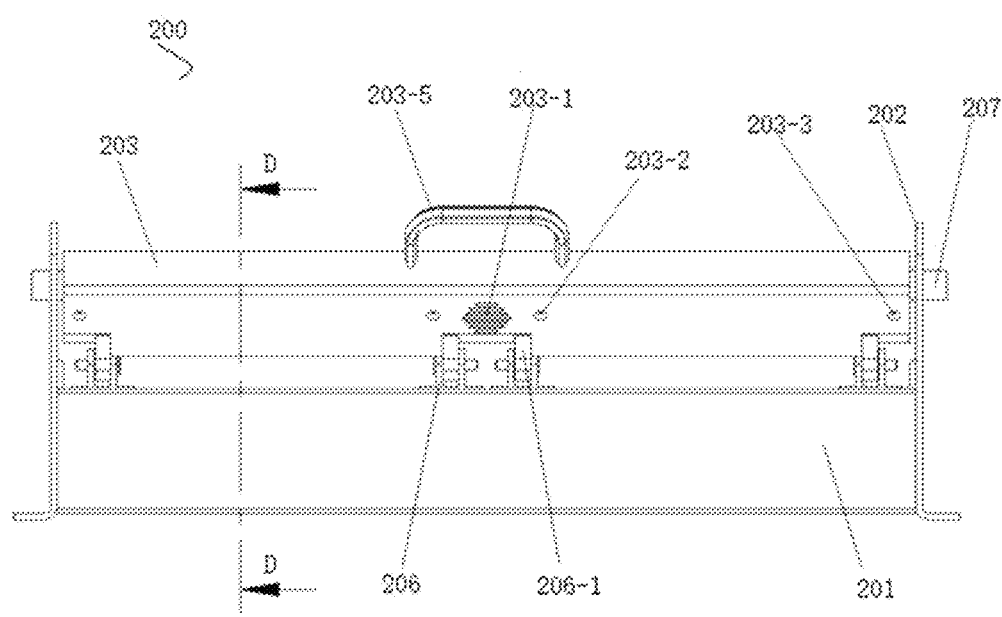
FIG. 9 is a structure diagram of an embodiment 2.
Figure 10:
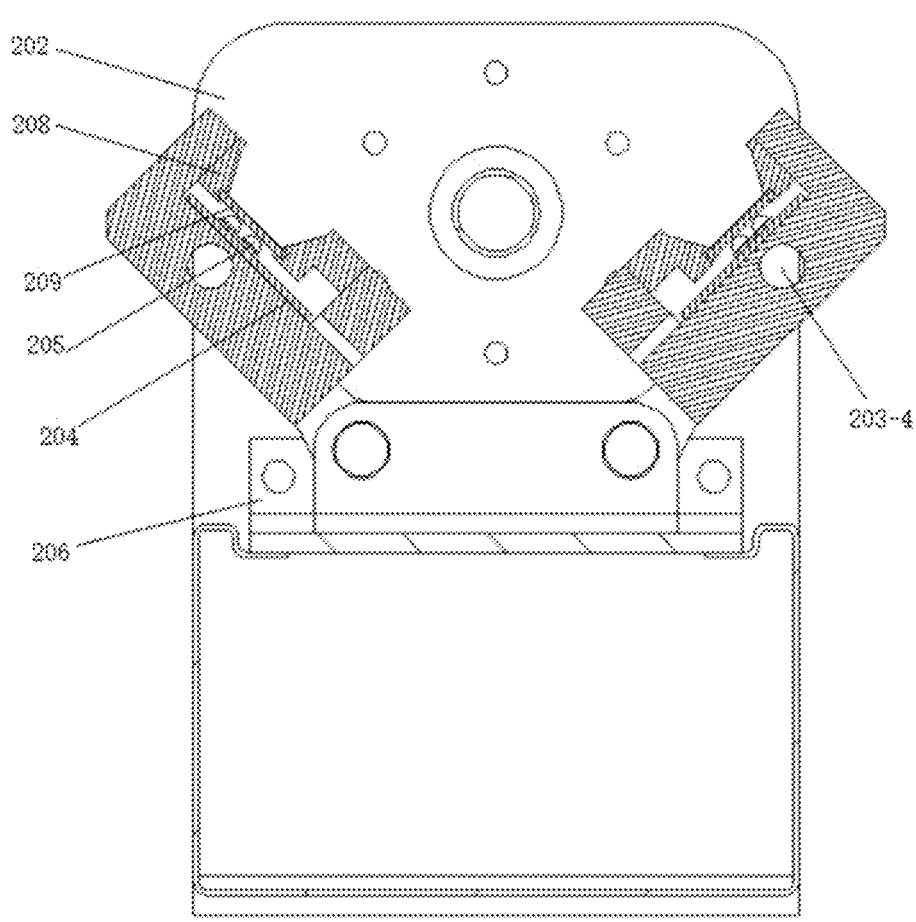
FIG. 10 is a sectional view taken along line D-D of FIG. 9.
Figure 11:
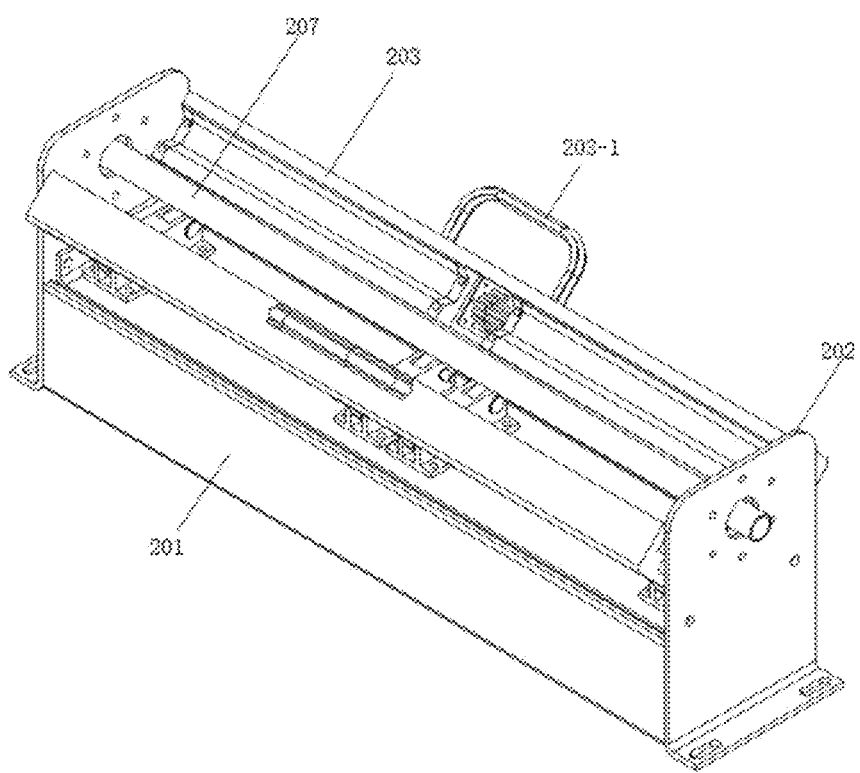
FIG. 11 is a perspective view of FIG. 9.

Referring to FIGS. 9 to 11, an ultraviolet curing device in this embodiment comprises an electrical box 201, two end plates 202, a water-cooled base 203, a copper substrate 204 and LED chips 205.

each of end plates 202 is fixed to each of the left and right ends of the electrical box 201, and an upper portion of the two end plates 202 is symmetrically provided with through-holes 2021. The through-holes 2021 in the two end plates 202 are provided with a quartz glass tube of high transmittance 207. An upper end surface of the electrical box 201 is provided with two water-cooled bases 203 which can open/close in forward and backward directions, respectively. Specifically, a plurality of mounting seats 206 are fixed and arranged on the upper end face of the electrical box 201 from left to right, and two rocker arms 206-1 are pivotably connected to front and rear ends of each of the plurality of mounting seats 206; and two water-cooled bases 203 are fixed on the rocker arms 206-1 located at the front and rear ends of the mounting seat 206 respectively. In addition, it can be contemplated that the two water-cooled bases 203 may be mounted to the upper end face of the electrical box 201 by other means.

A heat dissipation hole 203-1 is provided in a central portion of opposite side surfaces of the two water-cooled bases; a heat dissipation fan is mounted on the heat dissipation hole 203-1; left and right sides of the heat dissipation hole 203-1 are provided with a groove respectively, extending in a left-right direction and penetrating through left and right end faces of the two water-cooled bases 203; a rear face of each groove is provided with a water inlet 203-2 and a water outlet 203-3, and a cooling water channel 203-4 that is in communication with the water inlet 203-2 and the water outlet 203-3 is disposed within the water-cooled bases 203. A copper substrate 204 is fixed in the groove, and a plurality of LED chips 205 are uniformly distributed on the copper substrate 204. A reflector 208 is mounted on groove walls on both sides of the groove of the water-cooled base 203. An optical glass 209 covers on the plurality of LED chips 205, and both sides of the optical glass 209 are inserted into mounting slots at a lower portion of the reflector 208. A handle 203-5 is provided in the middle portion of the upper end face of the water-cooled base 203. After the two water-cooled bases 203 close, the LED chips 205 on the two water-cooled bases 203 are at the same height of the through-holes 2021 on the end plates 202.

A constant-current distribution plate and a multi-path constant-current board are disposed within the electrical box 201; the constant-current distribution plate and the multi-path constant-current board are electrically connected; and the multi-path constant-current board is electrically connected to the LED chips 205 in the grooves of the two water-cooled bases 203, respectively.

In operation, cables to be cured pass through the quartz glass tube of high transmittance 207, and a power supply of the electrical box 201 is turned on; the LED chips 205 start to cure the cables. In this case, the curing efficiency is very high, and a continuous curing can be achieved.

Embodiment III

Figure 12:
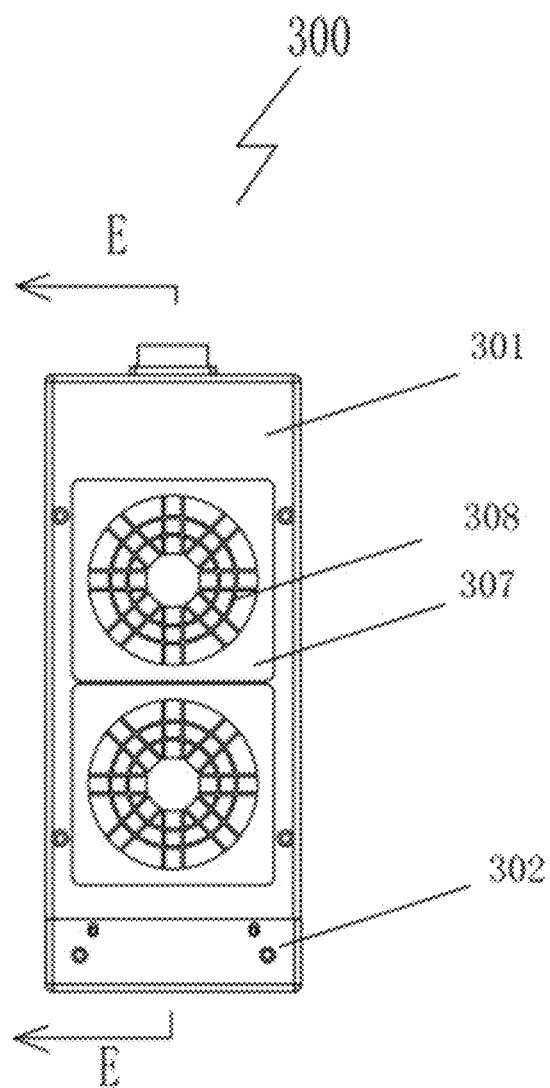
FIG. 12 is a structure diagram of an embodiment 3
Figure 13:
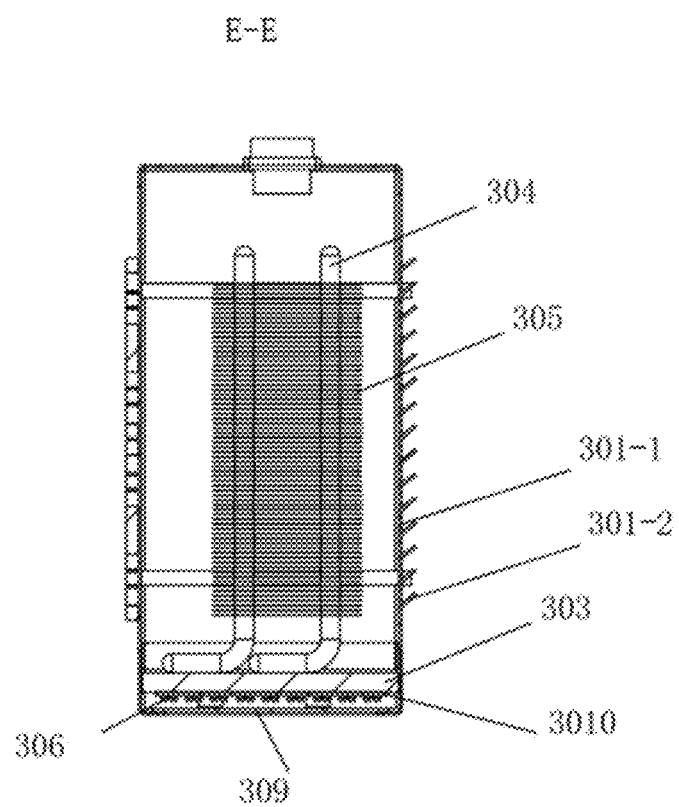
FIG. 13 is a sectional view taken along line E-E of FIG. 12.

As shown in FIGS. 12 and 13, the light source in this embodiment is the air-cooled ultraviolet light source, wherein the air-cooled ultraviolet light source comprises a shell, a heat dissipation module 303, LED chips 306 and a fan fixing plate 307; the shell comprises an upper shell 301 and a lower shell 302; the heat dissipation module 303 is fixed within an interior of the upper shell 301 and comprises a heat conduction cooper pipe 304 and a heat dissipation fin 305; the fan fixing plate 307 is disposed at a side wall of the upper shell 301, and has at least a fan 308 thereon; the LED chips 306 are disposed on the copper substrate 3010, the copper substrate 3010 is fixed at a bottom of the heat dissipation module 303, and the outer of which is covered with a glass 309, including a flat glass or an optical glass; a plurality of air vents 301-1 are disposed on a side of the upper shell 301, and a plurality of air deflectors 301-2 are disposed at the plurality of inclined air vent 301-1. The air-cooled ultraviolet light source in this embodiment has reasonable structure, good performance of the heat dissipation module; assembly and disassembly, and maintenance can be readily done; and manufacture and maintenance costs may be saved.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. An ultraviolet curing device, comprising: an ultraviolet light source and a controller connected by means of a cable, wherein the ultraviolet light source is a water-cooled ultraviolet light source or an air-cooled ultraviolet light source; the controller is provided inside or outside of the ultraviolet light source; the ultraviolet light source comprises a shell, a copper substrate, multiple paths of LED chips, and a cooling assembly; the controller comprises a constant-current circuit board, the ultraviolet light source is a water-cooled ultraviolet light source, and the water-cooled ultraviolet light source comprises: a shell, a light source water-cooled block, a copper substrate, multiple paths of LED chips, a constant-current board water-cooled block and a flat glass or a secondary optical glass; the light source water-cooled block is disposed in an interior of the shell along a length direction of the shell, and a first water inlet, a first water outlet and a first water storage cavity that is arranged in a middle portion are disposed on the light source water-cooled block; the copper substrate is fixed to the water-cooled block in segments; the multiple paths of LED chips are disposed on the copper substrate in segments respectively; a plurality of the constant-current circuit boards are provided on both sides of the constant-current board water-cooled block in two rows along the length direction of the shell, and each of the plurality of constant-current circuit boards is electrically connected to each of the multiple paths of LED chips respectively; a second water inlet, a second water outlet and a second water storage cavity are disposed on the constant-current board water-cooled block; and the multiple paths of LED chips are covered with the flat glass or the second optical glass.

2. The ultraviolet curing device of claim 1, wherein the constant-current board water-cooled block is fixed to a shell of the light source water-cooled block by means of water-cooled block supports.

3. The ultraviolet curing device of claim 2, wherein there are two water-cooled block supports, and the constant-current board water-cooled block is supported by the two water-cooled block supports at two ends thereof; or there are a plurality of the water-cooled block supports, the constant-current board water-cooled block is supported by the plurality of the water-cooled block supports at the bottom thereof.

4. The ultraviolet curing device of claim 3, wherein a water distribution bus is fixed within one end of the shell; a water inlet for allowing an entry of external cooled water, and a water distribution opening for distributing the cooled water to the light source water-cooled block and the constant-current board water-cooled block, are arranged on the water distribution bus.

5. The ultraviolet curing device of claim 4, wherein light shields are symmetrically disposed outside of the shell along the length direction of the shell; a length of the light shields is not less than a length of the multiple paths of LED chips.

6. The ultraviolet curing device of claim 5, wherein the light shields are L-shaped or H-shaped, and are provided with a plurality of fixing holes on a vertical side.

7. The ultraviolet curing device of claim 6, wherein two ends of the copper substrate are fixed with the shell by means of a light source block; two side edges of the flat glass or the optical glass in a length direction thereof are fixed by means of a glass cardboard.

8. A large-scale ultraviolet light source of claim 7, wherein the glass cardboard is divided into two segments on left and right sides, or more than two segments.

9. The ultraviolet curing device of claim 8, wherein two first water storage cavities are disposed on the light source water-cooled block; each of the two water storage cavities is in communication with a first water inlet and a first water outlet; and the copper substrate is divided into two rows, each of the two water storage cavities corresponds to a row of the copper substrate.

10. The ultraviolet curing device of claim 9, wherein each row of the copper substrate is provided in segments, and the multiple paths of LED chips are provided on each segment of the copper substrate; the number of the multiple paths of LED chips on each segment of the copper substrate is same or different.

11. The ultraviolet curing device of claim 10, wherein the ultraviolet light source further comprises a reflector and a reflector water-cooled block; the water distribution opening of the water distribution bus distributes the cooled water to the reflector water-cooled block.

12. The ultraviolet curing device of claim 11, wherein water pipes used in the ultraviolet light source are stainless steel pipes.

13. The ultraviolet curing device of claim 12, wherein the controller of the ultraviolet curing device comprises a monitoring circuit for light source energy, a monitoring circuit for external environment temperature, a voltage boost constant-current control circuit, a fault alarm circuit and a communication module; and the communication module is a wired communication module or a wireless communication module.

14. An ultraviolet curing device, comprising: an ultraviolet light source and a controller connected by means of a cable, wherein the ultraviolet light source is a water-cooled ultraviolet light source or an air-cooled ultraviolet light source; the controller is provided inside or outside of the ultraviolet light source; the ultraviolet light source comprises a shell, a copper substrate, multiple paths of LED chips, and a cooling assembly; the controller comprises a constant-current circuit board; wherein the air-cooled ultraviolet light source comprises a shell, a heat dissipation module, an LED chip and a fan fixing plate; the shell comprises an upper shell and a lower shell; the heat dissipation module is fixed within an interior of the upper shell and comprises a heat conduction cooper pipe and a heat dissipation fin; the fan fixing plate is disposed at a side wall of the upper shell, and has at least a fan thereon; the LED chip is disposed at a bottom of the heat dissipation module, and the flat glass or the optical glass covers outside of the LED chip.

15. The ultraviolet curing device of claim 14, wherein the controller of the ultraviolet curing device comprises a monitoring circuit for light source energy, a monitoring circuit for external environment temperature, a voltage boost constant-current control circuit, a fault alarm circuit and a communication module; and the communication module is a wired communication module or a wireless communication module.

16. An ultraviolet curing device, comprising: an ultraviolet light source and a controller connected by means of a cable, wherein the ultraviolet light source is a water-cooled ultraviolet light source or an air-cooled ultraviolet light source; the controller is provided inside or outside of the ultraviolet light source; the ultraviolet light source comprises a shell, a copper substrate, multiple paths of LED chips, and a cooling assembly; the controller comprises a constant-current circuit board; wherein the ultraviolet light source is the water-cooled ultraviolet light source, and the water-cooled ultraviolet light source comprises an electrical box, two end plates, a water-cooled base, a copper substrate and an LED chip; each of end plates is fixed to each of the left and right ends of the electrical box, and an upper portion of the two end plates is symmetrically provided with through-holes; an upper end surface of the electrical box is provided with two water-cooled bases which can open/close in forward and backward directions, respectively; opposite sides of the two water-cooled bases are provided with grooves extending in a left-right direction and penetrating through left and right end faces of the two water-cooled bases, a plurality of copper substrates are fixed in the grooves, and LED chips are disposed on each of plurality of copper substrates; after the two water-cooled bases close, the LED chips on the two water-cooled bases are at the same height of the through-holes on the end plates.

17. The ultraviolet curing device of claim 16, wherein an interior of the electrical box is provided with a constant-current distribution plate and a multi-path constant-current board; the constant-current distribution plate and the multi-path constant-current board are electrically connected; and the multi-path constant-current board is electrically connected to the LED chips in the grooves of the two water-cooled bases, respectively.

18. The ultraviolet curing device of claim 17, wherein a plurality of mounting seats are fixed and arranged on the upper end face of the electrical box from left to right; two rocker arms are pivotably connected to front and rear ends of each of the plurality of mounting seats; and two water-cooled bases are fixed on the rocker arms located at the front and rear ends of the mounting seat respectively.

19. The ultraviolet curing device of claim 18, wherein the through-holes in the two end plates are provided with a quartz glass tube of high transmittance.

20. The ultraviolet curing device of claim 17, wherein the water-cooled base is provided with a heat dissipation hole in a middle portion of a side surface of the groove, a heat dissipation fan is mounted on the heat dissipation hole, and left and right sides of the heat dissipation hole are provided with a groove respectively, a copper substrate is fixed in each of the grooves, and an LED chip is fixed on the copper substrate; a water inlet and a water outlet are arranged on a back surface of each of the grooves, and a cooling water channel, in connection with the water inlet and the water outlet, is provided in the water-cooled base.

21. The ultraviolet curing device of claim 20, wherein a reflector is mounted on groove walls on both sides of the groove of the water-cooled base.

22. The ultraviolet curing device of claim 21, wherein the LED chip is covered with the flat glass or the optical glass.

23. The ultraviolet curing device of claim 22, wherein both sides of the flat glass or the optical glass are inserted into mounting slots at a lower portion of the reflector.

24. The ultraviolet curing device of claim 23, wherein a handle is provided in the middle portion of the upper end face of the water-cooled base.

25. The ultraviolet curing device of claim 24, wherein the controller of the ultraviolet curing device comprises a monitoring circuit for light source energy, a monitoring circuit for external environment temperature, a voltage boost constant-current control circuit, a fault alarm circuit and a communication module; and the communication module is a wired communication module or a wireless communication module.

* * * * *